(12) United States Patent
Chua

(10) Patent No.: US 8,680,406 B2
(45) Date of Patent: Mar. 25, 2014

(54) RADIATION-PROOF LAMINATE FOR ELECTRONIC DEVICES AND METHOD FOR EMBEDDING THE SAME INTO A CASE

(75) Inventor: Kok Tshun Chua, N.T. (CN)

(73) Assignee: Trend Power Limited, N.T., Hong Kong (CN)

( * ) Notice: Subject to any disclaimer, the term of this patent is extended or adjusted under 35 U.S.C. 154(b) by 70 days.

(21) Appl. No.: 13/590,771

(22) Filed: Aug. 21, 2012

(65) Prior Publication Data

US 2013/0056257 A1    Mar. 7, 2013

Related U.S. Application Data

(60) Provisional application No. 61/531,878, filed on Sep. 7, 2011.

(51) Int. Cl.
*H05K 9/00* (2006.01)

(52) U.S. Cl.
USPC ............................ 174/392; 428/328; 264/478

(58) Field of Classification Search
USPC ............................ 174/392; 428/328; 264/478
See application file for complete search history.

(56) References Cited

U.S. PATENT DOCUMENTS

| | | | | |
|---|---|---|---|---|
| 5,360,941 A | * | 11/1994 | Roes | 174/378 |
| 5,455,116 A | * | 10/1995 | Nagano et al. | 428/545 |
| 5,455,117 A | * | 10/1995 | Nagano et al. | 428/545 |
| 6,284,363 B1 | * | 9/2001 | Maeda et al. | 428/328 |
| 7,060,350 B2 | * | 6/2006 | Takaya et al. | 428/323 |
| 8,114,512 B2 | * | 2/2012 | Kojima | 428/328 |
| 8,449,808 B2 | * | 5/2013 | Lin | 264/482 |
| 2005/0029919 A1 | * | 2/2005 | Notohara et al. | 313/326 |
| 2010/0003502 A1 | * | 1/2010 | Nashiki et al. | 428/328 |
| 2010/0234081 A1 | | 9/2010 | Wong et al. | |
| 2011/0316759 A1 | * | 12/2011 | Fan et al. | 343/873 |

FOREIGN PATENT DOCUMENTS

| | | |
|---|---|---|
| CN | 1356020 A | 6/2002 |
| CN | 2701181 Y | 5/2005 |
| CN | 201781733 U | 3/2011 |

* cited by examiner

*Primary Examiner* — Hung Ngo
(74) *Attorney, Agent, or Firm* — Rabin & Berdo, P.C.

(57) ABSTRACT

A radiation-proof laminate for electronic devices has: a substrate layer consisting of an electrically conductive material, and a first radiation barrier layer formed on the substrate layer, wherein the first radiation barrier layer comprises 50 wt % to 70 wt % of rubber-based heat-bonding adhesive compound in the form of powder or liquid, 5 wt % to 20 wt % of aluminum powder, 5 wt % to 20 wt % of copper powder, and 5 wt % to 20 wt % of silver powder; wherein the aluminum, copper, and silver powder are mediated by the rubber-based heat-bonding adhesive compound to disperse and form a mesh-like distribution. The radiation-proof laminate can absorb electromagnetic radiation from the electronic device and redirect RF radiation while maintaining the RF signal strength not to be substantially affected or attenuated by the radiation-proof laminate, to maintain the network connection performance of the electronic device. A method for embedding the radiation-proof laminate into a case of the electronic device is also provided.

29 Claims, 4 Drawing Sheets

RADIATION-PROOF LAMINATE FOR ELECTRONIC DEVICES AND METHOD FOR EMBEDDING THE SAME INTO A CASE

TECHNICAL FIELD

The present invention relates generally to a radiation-proof laminate for electronic devices and, more particularly, to a laminate provided with at least one radiation barrier layer for absorbing electromagnetic radiation and redirecting RF radiation of a user side while maintaining the RF signal strength not to be substantially affected or attenuated. The present invention also relates to a method for embedding the radiation-proof laminate into a case of electronic device.

BACKGROUND OF THE INVENTION

Nowadays, portable electronic devices such as mobile phones and tablet computers become more and more popular. These portable electronic devices require wireless transmission of data. However, the radiation power shall be sufficiently strong to enable the data transmission of the portable electronic devices, thereby inevitably producing radiation, for example, electromagnetic radiation and/or RF radiation which is harmful to people.

A variety of radiation-proof mechanisms have been developed for controlling the radiation associated with portable electronic devices to prevent undesired exposure to people. However, these mechanisms are either expensive or less effective.

For example, the patent application US 2010/0234081 A1 has disclosed a case for redirecting away RF radiation from user side of the portable communication device, wherein a radiation-proof system in the case includes a coupling loop mounted on the back of the communication device, a signal transmitting "ladder" composed of horizontal metallic strips, and a transmitting antenna (such as a patch antenna); wherein the electromagnetic wave from an internal antenna of the portable communication device is coupled to the ladder through the coupling loop of the case, and then redirected by the patch antenna of the case in a direction away from the user, whereby reducing the amount of electromagnetic radiation directed towards the user. In the patent application, the position of the coupling loop with respect to the internal antenna is critical; and as shown in FIG. 5 of the patent application, the radiation-proof system must be placed at a distance of about 1 mm from the case of the portable communication device, which will, on one hand, make the size of the case to be relatively large, and on the other hand, it is hard for the coupling loop to be kept at an optimum position with respect to the internal antenna, whereby resulting in a less effective radiation-proof effect.

Chinese Utility Model patent ZL03249073.9 (Issue No. CN2701181Y) has disclosed a radiation-proof device for mobile phones, wherein an electromagnetic wave shielding layer is provided on an internal case and/or an external case of the mobile phone, an antenna is in electrical connection with an power amplifier feeder line and is arranged at outside of the electromagnetic wave shielding layer when the mobile phone is in an answering state, while an insulation barrier layer is provided between the antenna and the electromagnetic wave shielding layer. In the patent, the antenna is arranged at outside of the electromagnetic wave shielding layer, and the electromagnetic wave shielding layer is arranged on the case of the mobile phone, which means that the antenna must be arranged at outside of the case of the mobile phone. As the existing mobile phones on the market are basically provided with a built-in antenna, so the patent requires a modification to the structure of an existing mobile phone (particularly the antenna structure), and it could not be adapted for use as a separate protective shell mounted outside of a mobile phone.

Therefore, it is necessary for a radiation-proof material which could effectively provide the radioprotection for the user of the portable electronic devices, and particularly, could act as a separate protective case to easily mount at or detach from an electronic device.

SUMMARY OF THE PRESENT INVENTION

Therefore, an objective of the present invention is to provide a radiation-proof laminate that is able to provide to a user with a cost effective solution to the electromagnetic radiation and/or RF radiation.

Another objective of the present invention is to eliminate the potential harm to the user caused by the electromagnetic and RF radiation generated by the portable electronic devices.

In the present application, the inventor will divide the radiation generated by an electronic device into two different types of radiation, namely RF radiation and electromagnetic radiation. Currently, the band used by a variety of wireless communication technologies (such as, GSM, CDMA, etc.) is respectively within the range of about 800 MHz-960 MHz and 1700 MHz-2200 MHz, namely within the frequency range of signal carrier frequency of the mobile phone. In this regard, the RF radiation of an electronic device, such as a mobile phone, refers to the radiation of a frequency of the signal carrier frequency and its harmonic of the electronic device, or can be regarded as the radiation generated by a communication signal (RF) and its harmonic of the electronic device, so it is called as the RF radiation. The electromagnetic radiation refers to unwanted electromagnetic waves generated in operation of various elements or components of an electronic device (such as a mobile phone), which means the unwanted electromagnetic waves are useless for the operation of the mobile phone, and they are of frequency generally in the range of 0.1 MHz-300 MHz, for example. These unwanted electromagnetic waves also produce radiation towards the user, and which will be herein referred to as electromagnetic radiation.

In order to realize above objects, the present invention provides a radiation-proof laminate for electronic devices, comprising:

a substrate layer consisted of an electrically conductive material, and a first radiation barrier layer formed on the substrate layer, wherein the first radiation barrier layer comprises about 50 wt % (percentage by weight) to 70 wt % of rubber-based heat-bonding adhesive compound in the form of powder or liquid/fluid, about 5 wt % to 20 wt % of aluminum powder, about 5 wt % to 20 wt % of copper powder, and about 5 wt % to 20 wt % of silver powder;

wherein the aluminum powder, the copper powder, and the silver powder are mediated by the rubber-based heat-bonding adhesive compound to disperse and form a mesh-like distribution.

In one embodiment of the present invention, a second radiation barrier layer is formed on the first radiation barrier layer, wherein the second radiation barrier layer is formed with a material capable of absorbing electromagnetic radiation. Preferably, the second radiation barrier layer is an aluminum film having purity above 80%, due to its excellent capacity for absorbing electromagnetic radiation.

In another embodiment of the present invention, a third radiation barrier layer is formed on the second radiation barrier layer, wherein the third radiation barrier layer is formed with a material capable of absorbing electromagnetic radiation. Preferably, the third radiation barrier layer comprises 70 wt % to 95 wt %, preferably about 90 wt %, of rubber based adhesive compound in the form of powder or liquid/fluid and 5 wt % to 30 wt %, preferably 10 wt %, of aluminum powder.

According to the present invention, the aluminum, copper, and silver powders might also be respectively replaced by their respective metal compounds, such as metal oxides, as long as they can be mediated by the rubber-based heat-bonding adhesive compound to disperse and form a mesh-like distribution.

A conductive layer of pattern might also be formed on one side of the radiation-proof laminate being opposite to the first radiation barrier layer, so as to enhance the effect of redirection of RF and obtain a better electromagnetic effect The first, second and third radiation barrier layers of the present invention could absorb electromagnetic radiation from the electronic device and redirecting RF radiation of a user side while keeping the RF signal strength not to be substantially affected or attenuated by the radiation-proof laminate, so as to maintain the network connection performance of the electronic device.

The present invention also provides a method for embedding the radiation-proof laminate into a case of the electronic device, comprising the steps of:
  providing a plastic backplate having a molding temperature above 220° C.;
  placing a radiation-proof laminate of the present invention on a surface of the plastic backplate for better positioning of the laminate;
  placing the plastic backplate with the laminate into a mold for producing the case of the electronic device; and
  injection molding the case of the electronic device in a way that the plastic backplate and the laminate are embedded into the case of the electronic device.

The present invention provides another method for embedding the radiation-proof laminate into a case of the electronic device, comprising the steps of:
  injection molding the case of the electronic device;
  placing and fixing a radiation-proof laminate of the present invention into a mold for producing a plastic backplate having a molding temperature below 200° C.;
  placing the molded case of the electronic device having its lower surface facing the radiation-proof laminate into the mold for the plastic backplate; and
  injection molding the plastic backplate in a way that the plastic backplate and the laminate are embedded into the case of the electronic device.

Preferably, the case of the electronic device is a case of mobile phone.

Alternatively, the radiation-proof laminate of the present invention could be made into the form of a sheet, which might be simply placed at the back of the mobile phone (for example, it might be adhered to the back of the mobile phone) or it might be simply placed in the case of the mobile phone (for example, it might be interposed between the case and the mobile phone).

The radiation-proof laminate of the present invention might be attached to either outside or inside of the back side of the mobile phone, such that it is in surface contact with the back side of the mobile phone, wherein the substrate layer abuts against the back side of the mobile phone, and the third radiation barrier layer is the outermost layer.

The laminate of the present invention is preferably located in the vicinity of the positions where the electromagnetic wave is generated, received and/or exists.

The radiation-proof laminate of the present invention is adapted for use with electronic devices, particularly with portable electronic devices, such as a mobile phone, a tablet computer, and the like. The radiation-proof laminate of the present invention could redirect the RF radiation without affecting or attenuating the signal strength, while it could absorb the electromagnetic radiation associated with the mobile phone, whereby providing effectively an radiation-proof effect to the users of portable electronic devices.

DETAILED DESCRIPTION OF THE PREFERRED EMBODIMENTS

Figure 1:
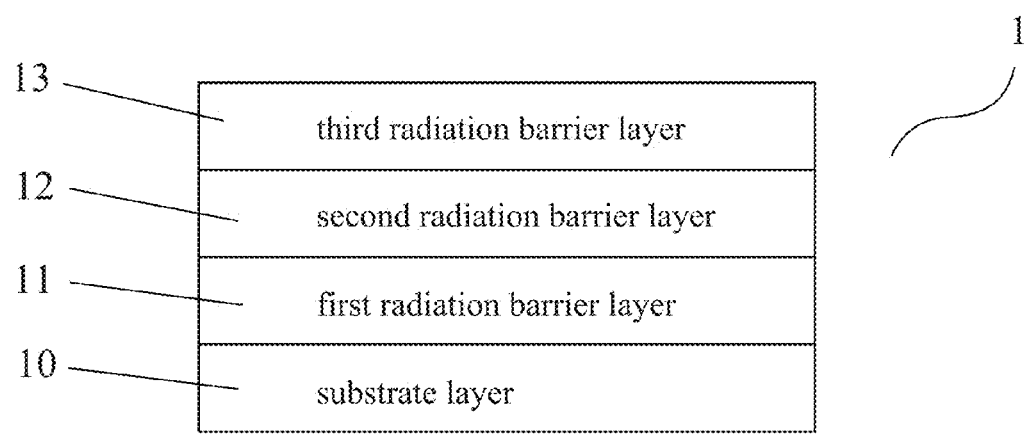
FIG. 1 illustrates a perspective view of a laminate according to an embodiment of the present invention.

The present invention provides a radiation-proof laminate, comprising a substrate layer and one or more radiation barrier layers formed successively over the substrate layer, wherein the first radiation barrier layer is formed with the aluminum powder, the copper powder, the silver powder, and the rubber-based heat-bonding adhesive compound, wherein the aluminum powder, the copper powder, the silver powder, and the rubber-based heat-bonding adhesive compound are mixed in a certain ratio, which enables the foregoing metal powders (the aluminum powder, the copper powder, the silver powder) to be mediated by the rubber-based heat-bonding adhesive compound to disperse and form a mesh-like distribution (for example upon application of electricity). The second and third radiation barrier layers are formed with materials capable of absorbing electromagnetic radiation.

In a first embodiment of the present invention, the radiation-proof laminate comprises: a substrate layer consisted of an electrically conductive material, and a first radiation barrier layer formed on the substrate layer, wherein the first radiation barrier layer comprises about 50 wt % to 70 wt % of rubber-based heat-bonding adhesive compound in the form of powder or liquid/fluid, about 5 wt % to 20 wt % of aluminum powder, about 5 wt % to 20 wt % of copper powder, and about 5 wt % to 20 wt % of silver powder, all of which are mixed and then the aluminum powder, the copper powder, and the silver powder are mediated by the rubber-based heat-bonding adhesive compound to disperse and form a mesh-like distribution upon application of electricity.

The substrate layer is preferably formed with a material of good electrical conductivity, for example copper. More preferably, the substrate layer is formed with a copper film having purity above 80%. The substrate layer has a thickness which may be as thin as possible, and may be in the range of 0.03 mm to 0.1 mm, more preferably about 0.05 mm.

The first radiation barrier layer is formed by mixing the aluminum powder, the copper powder, the silver powder, and the rubber-based heat-bonding adhesive compound in the form of powder and applying the mixture (e.g. by spraying) onto the substrate layer to form a single layer configuration.

The ratio of the foregoing four substances (aluminum, copper, silver, and rubber-based heat-bonding adhesive compound) in the first radiation barrier layer enables the foregoing metal powders (the aluminum powder, the copper powder, the silver powder, and the rubber-based heat-bonding adhesive compound in the form of powder) to be mediated, without any chemical or mechanical processing, by the rubber-based heat-bonding adhesive compound to disperse and form a mesh-like distribution upon application of electricity (for example when the mobile phone is energized). Wherein the aluminum powder, the copper powder, and the silver powder will not be bonded together by the rubber-based heat-bonding adhesive compound, to the contrary, the aluminum powder, the copper powder, and the silver powder will be dispersed and form a mesh-like distribution.

The first radiation barrier layer preferably comprises about 55 wt % to 62 wt % of rubber-based heat-bonding adhesive compound, about 8 wt % to 15 wt % of aluminum powder, about 8 wt % to 15 wt % of copper powder, and about 8 wt % to 15 wt % of silver powder, more preferably about 60 wt % of rubber-based heat-bonding adhesive compound, about 10 wt % of aluminum powder, about 10 wt % of copper powder, and about 10 wt % of silver powder.

The rubber based heat-bonding adhesive compound may be selected from any rubber compound that allows for the formation of the mesh-like distribution of the aluminum, copper and silver powders. For example, the rubber compound is PC888 which is an environmentally benign agent.

The particle size of each of the rubber based heat-bonding adhesive compound powder and the aluminum, copper and silver powders may be in the range of 500 μm to 1000 μm, preferably 700 μm to 900 μm, and more preferably about 800 μm, allowing for the formation of an ultra fine mesh-like distribution.

The thickness of the first radiation barrier layer may be in the range of 0.03 mm to 0.1 mm, more preferably about 0.05 mm.

The aluminum powder, the copper powder and the silver powder could be mixed with the rubber based heat-bonding adhesive compound, and then sprayed on the substrate to form a mesh-like distribution. According to a test, such a mesh-like distribution is able to re-direct the RF radiation along the edges of the laminate away from the user side while ensures that the strength of RF signal of an electronic device is not substantially affected.

In addition to the metal elements, the metal compounds such as metal oxides are possible for use in the first radiation barrier, as long as they can form a mesh-like distribution by the rubber based heat-bonding adhesive as a medium, for example, upon application of electricity, which means the aluminum, copper, and silver powders could be respectively replaced by their respective metal compounds, such as metal oxides.

In use, the radiation-proof laminate of the present invention will be in full surface contact with the back side of the mobile phone, wherein the substrate layer abuts against the back side of the mobile phone, and the first radiation barrier layer is the outermost layer.

In a second embodiment of the present invention, the radiation-proof laminate comprises: a substrate layer consisted of an electrically conductive material, a first radiation barrier layer formed on the substrate layer, and a second radiation barrier layer formed on the first radiation barrier layer. The substrate layer and the first radiation barrier layer of this second embodiment may be same in structure and composition as those described in the above first embodiment.

The second radiation barrier layer is formed with a material capable of absorbing electromagnetic radiation. The second radiation barrier layer is preferably an aluminum film having purity above 80%, due to its excellent capacity for absorbing electromagnetic radiation. The second radiation barrier layer has a thickness which may be in the range of 0.05 mm to 0.15 mm, more preferably about 0.1 mm.

The second radiation barrier layer may be bonded onto the first radiation barrier layer using any means known in the art, for example, by heat-bonding at a temperature about 220° C.

In use, the radiation-proof laminate of the present invention will be in full surface contact with the back side of the mobile phone, wherein the substrate layer abuts against the back side of the mobile phone, and the second radiation barrier layer is the outermost layer. FIG. 1 illustrates a radiation-proof laminate 1 according to a third embodiment of the present invention. The radiation-proof laminate 1 comprises: a substrate layer 10 consisted of an electrically conductive material, a first radiation barrier layer 11 formed on the substrate layer, a second radiation barrier layer 12 formed on the first radiation barrier layer, and a third radiation barrier layer 13 formed on the second radiation barrier layer. The substrate layer 10 and the first and second radiation barrier layers 11, 12 of the third embodiment may be identical in structure and composition as those described in the above second embodiment.

The third radiation barrier layer 13 is formed with a material capable of absorbing electromagnetic radiation, and the third radiation barrier layer 13 could be formed with a material identical to or different from the same of the second radiation barrier layer. The third radiation barrier layer 13 preferably comprises 70 wt % to 95 wt % (preferably about 90 wt %) of rubber based adhesive compound (the rubber may be for example PC888) in the form of powder or liquid/fluid and 5 wt % to 30 wt % (preferably 10 wt %) of aluminum powder. In this case, the third radiation barrier layer could be formed as follows: the aluminum powder and the rubber based adhesive compound in the form of powder could be mixed in the foregoing ratio at room temperature and then applied (e.g. by spraying) onto the second radiation barrier layer, and subsequently under heat-bonding. The second radiation barrier layer and the third radiation barrier layer will be bonded together due to the presence of rubber based adhesive compound.

Similarly, the aluminum powder could be mediated by the rubber-based heat-bonding adhesive compound to disperse and form a mesh-like distribution on the second radiation barrier layer upon the action of electricity (for example when the mobile phone is energized). This will further facilitate the absorption of electromagnetic radiation and the redirection of the RF radiation.

For the third radiation barrier layer 13, the particle size of each of the rubber based heat-bonding adhesive compound powder and the aluminum powder may be in the range of 500 μm to 1000 μm, preferably 700 μm to 900 μm, and more preferably about 800 μm.

The third radiation barrier layer has a thickness which may be in the range of 0.03 mm to 0.1 mm, more preferably about 0.05 mm.

In use, the radiation-proof laminate of the present invention will be advantageously in full surface contact with the back side of the mobile phone, wherein the substrate layer abuts against the back side of the mobile phone, and the third radiation barrier layer is the outermost layer.

According to the present invention, when the radiation-proof laminate is mounted properly on an electronic device (e.g. a mobile phone), the first radiation barrier layer having the mesh-like distribution is capable of re-directing the RF radiation along the edges of the laminate to an outer side which is opposite (or perpendicular if in a plane) to the user side of the mobile phone that away from the user side, while the signal strength of the mobile phone is not generally affected or attenuated, and the electromagnetic radiation will be partially absorbed. In addition, the first radiation barrier layer might also absorb a large part of electromagnetic radiation associated with the mobile phone, as the aluminum powder and the rubber powder are included in the first radiation barrier layer. Furthermore, the second and third radiation barrier layers, both of which comprise aluminum film or aluminum powder, absorb the remaining electromagnetic radiation. Because of the presence of the second and third radiation barrier layers, the electromagnetic radiation generated by the mobile phone will be substantially absorbed totally by the laminate of the present invention.

The inventor of the present invention has found that formation of electrically conductive layer having at least one pair of patterns with meandering curve parts or other patterns such as rhombs, loops or strips on the radiation-proof laminate of the present invention (particularly the substrate layer of the radiation-proof laminate) can enhance the effect of redirection of RF radiation and obtain a better electromagnetic effect.

Figure 2:
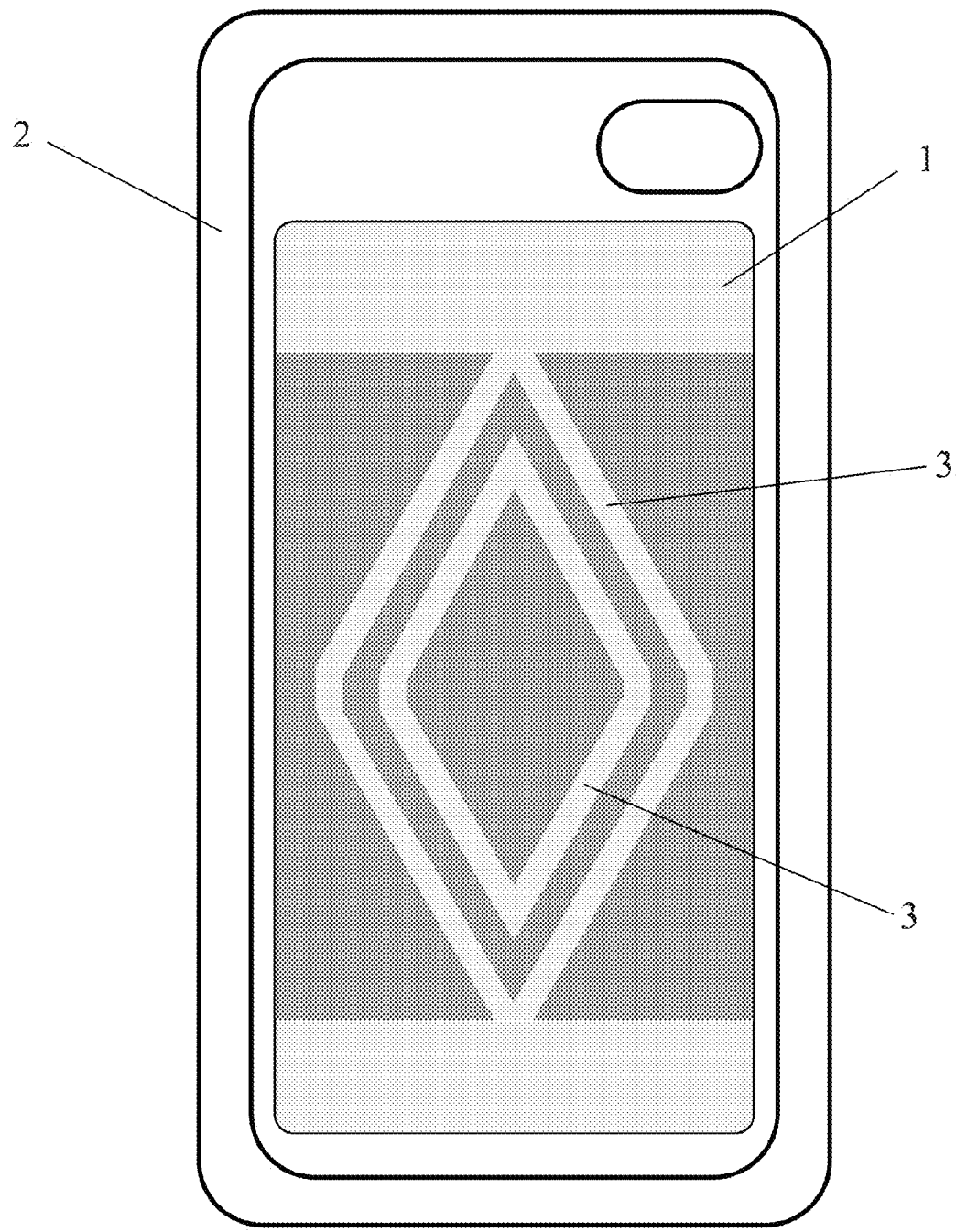
FIG. 2 illustrates a schematic view of a case of mobile phone containing the laminate of the present invention on which a pattern is formed.
Figure 3:
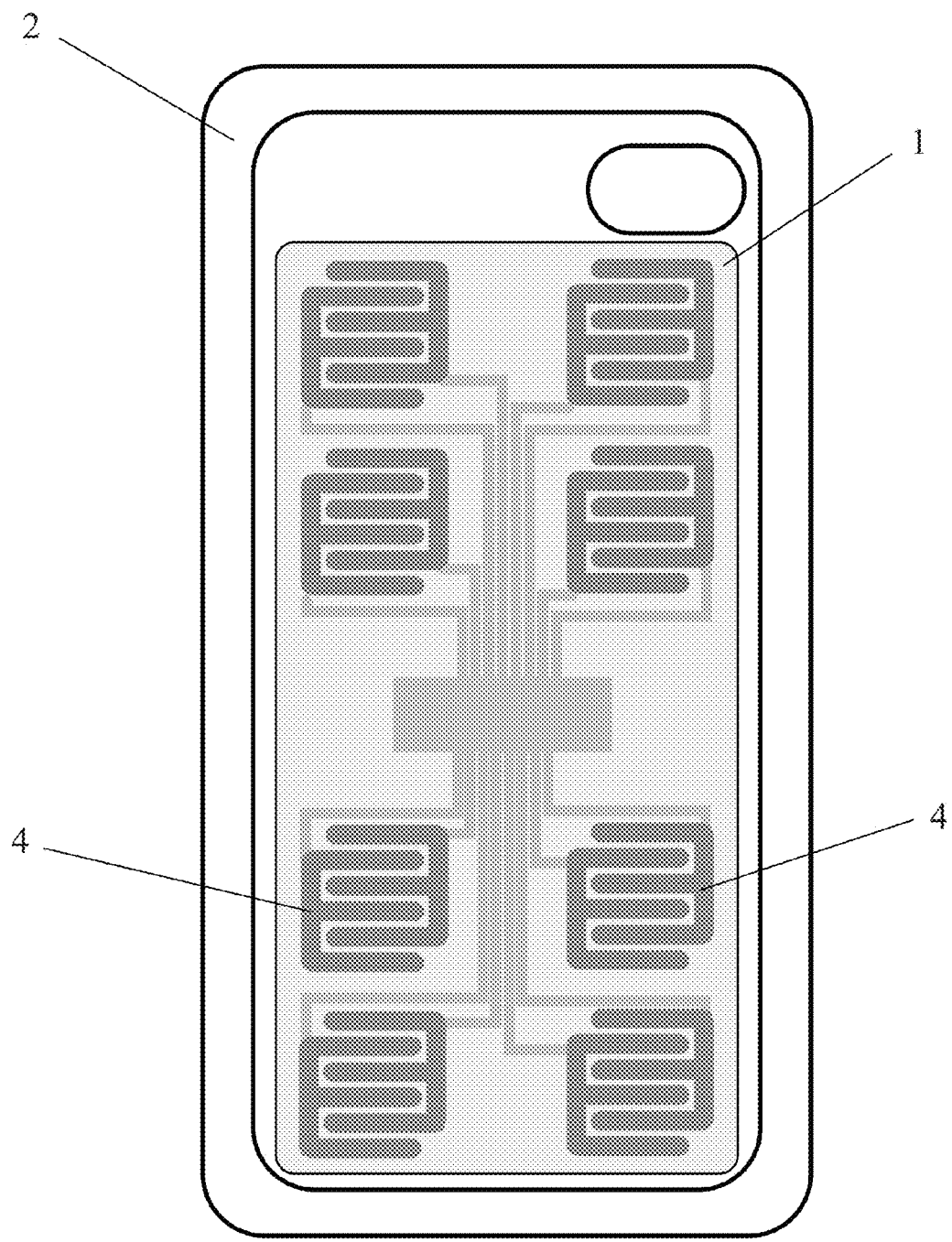
FIG. 3 illustrates a schematic view of a case of mobile phone containing the laminate of the present invention on which another pattern is formed.

FIGS. 2 and 3 illustrate respectively a pattern formed on a radiation-proof laminate of the present invention, wherein the radiation-proof laminate 1 is mounted in a protective case 2 of a mobile phone. As shown is FIG. 2, a pattern 3 similar to the shape of a tilted "回" (a Chinese character) or "<< >>" is formed on central region of the surface of the substrate layer of the radiation-proof laminate 1, namely the pattern is of two parallel and concentric rhombs being of different sizes which are nested together.

The pattern of FIG. 3 is a little bit more complex, which comprises a plurality of vertical and horizontal parallel lines to form a dendritic pattern 4, similar to a maze of wiring of an integrated circuit or conductive connection traces of circuitry on a printed circuit board.

The patterns shown in FIGS. 2 and 3 could be formed using coating, photoengraving, and etching methods well known in the field of electronic technology. The pattern might be made of an electrically conductive material, which might be selected from aluminum, copper or a combination thereof. For example, the pattern might be formed by coating or plating a layer of aluminum or copper on one surface of the substrate layer being opposite to the first radiation barrier layer, and then etching the coated layer to form a predetermined pattern. It should be noted that, the lines of the pattern of the shape of "回" of FIG. 2 could be exposed or etched while retaining the rest of the metal layer during the etching process, for example.

After testing the radiation-proof effect of the radiation-proof laminate having a pattern of the present invention, the test result is provided as in the following Table 1.

TABLE 1

| SAR (Specific Absorption Rate) MEASUREMENT | |
|---|---|
| Ambient Temperature (° C.): 21.5 ± 2 | Relative Humidity(5): 52 |
| Liquid Temperature (° C.): 21.05 ± 2 | Depth of Liquid (cm): >15 |

| Product: Radiation-proof Case | | | | | | |
|---|---|---|---|---|---|---|
| Test Position | Antenna | Frequency | Average Power | Power Drift | SAR 1 g | Limit |
| Head | Position | Channel MHz | (dBm) | (<±0.2) | (W/kg) | (W/kg) |

TABLE 1-continued

| Test Mode: iPhone 4 without the radiation-proof laminate of the present invention | | | | | | |
|---|---|---|---|---|---|---|
| Left-Cheek | Fixed | 189 | 836.4 | — | — | 1.72 | 1.6 |
| Right-Cheek | Fixed | 189 | 836.4 | — | — | 1.01 | 1.6 |
| Test Mode: iPhone 4 with the radiation-proof laminate having a pattern shown in FIG. 3 | | | | | | |
| Left-Cheek | Fixed | 189 | 836.4 | — | — | 0.211 | 1.6 |
| Test Mode: iPhone 4 with the radiation-proof laminate having a pattern shown in FIG. 2 | | | | | | |
| Left-Cheek | Fixed | 189 | 836.4 | — | — | 0.386 | 1.6 |

As can be seen, the above results revealed that the SAR values of the iPhone using the radiation-proof laminate of the present invention have been greatly decreased compared to the SAR value of the iPhone without the radiation-proof laminate of the present invention.

The radiation-proof laminate of the present invention may be attached to either outside or inside of the back side of the mobile phone using any means known in the art, such that it is in surface contact with the back side of the mobile phone. The laminate is preferably located in the vicinity of the positions where the electromagnetic wave is generated, received and/or exists.

Another aspect of the present invention relates to a method for attaching a laminate of the present invention on a case of a mobile phone by embedding the laminate into the phone case, which comprises the steps of:

providing a plastic backplate, such as a PC (polymeric engineering plastic, such as polycarbonate) backplate, having a molding temperature above 220° C., placing the radiation-proof laminate of the present invention on a surface of the PC backplate for better positioning of the laminate, placing the PC backplate with the laminate into a mold for producing a silicone phone case, and injection molding the silicone phone case at 160° C. to 170° C., with the result of the PC backplate and the laminate being embedded thereinto.

Figure 4:
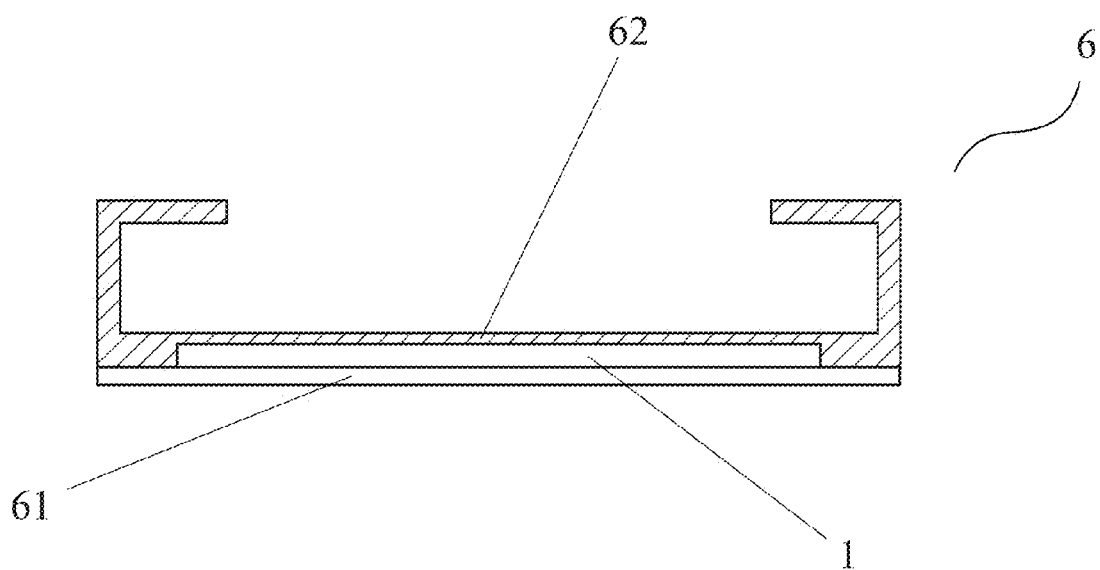
FIG. 4 illustrates a perspective view of a case of mobile phone containing the laminate of the present invention, wherein a plastic backplate and laminate of the present invention are embedded into the case.

FIG. 4 illustrates a perspective view of a case of mobile phone manufactured with the foregoing method, wherein a radiation-proof laminate of the present invention is embedded thereinto. As shown in FIG. 4, the case 6 for mobile phone is made of a silicone, and the case comprises a plastic backplate 61, a silicone body 62, and the radiation-proof laminate 1. The radiation-proof laminate 1 is embedded into a recess of the silicone case and interposed between the plastic backplate 61 and the silicone body 62.

The radiation-proof laminate of the present invention could not be used under a temperature above 200° C., as the structure of the rubber-based heat-bonding adhesive compound contained in the radiation-proof laminate (e.g. the first and third radiation barrier layers) will be destroyed once the temperature exceeds 220° C. The molding temperature of the plastic backplate 61 is 250-260° C., and the molding temperature of the silicone is 160-170° C., such that the plastic backplate 61 could withstand the molding temperature of the silicone. More importantly, the plastic backplate 61 enables the radiation-proof laminate of the present invention to be properly positioned. As the molding temperature of the silicone is 160-170° C., the radiation-proof laminate of the present invention will not be damaged during the injection molding process of the silicone case.

For the purpose of anti-radiation, the mobile phone may be simply received in the silicone phone case after the phone case is produced according to the above method.

There are few combinations of materials (such as thermal plastics) that can be used to manufacture the above phone case. The combinations above are chosen as it is relatively more economic and time saving for fabrication of the injection mould. The principal of choosing combinations is that the two materials must have different setting/curing temperature, preferably difference in 50-100° C., in order to securely embed the laminate within the phone case without subjecting the laminate to temperature above 240° C., so as not to affect the integrity of the radiation barrier layer.

The material combination selected from the following could be used in production of the case of mobile phone described above:

| Backplate/curing temperature | + | phone case/curing temperature |
|---|---|---|
| 1) PC/220-230° C. | + | TPU/160-170° C. |
| 2) Silicone A/190-200° C. | + | Silicone Type B/150-160° C. | wherein, PC is polycarbonate, TPU is the abbreviated name of thermoplastic polyurethane elastomer rubber, and TPR is the abbreviated name of thermoplastic rubber or thermoplastic elastomer, while "+" means a combination of two materials.

Silicone A and Silicone B are respectively referred to different types of silicone, both of which are known in the art.

Alternatively, a combination of a plastic backplate of a relatively low curing/molding temperature and a case material of a relatively high curing/molding temperature could be employed, such as the material combination selected from the following.

| Backplate/curing temperature. | + | phone case/curing temperature. |
|---|---|---|
| 3) TPR/160-170° C. | + | PC/220-230° C. | wherein, TPR is the short form of thermoplastic rubber or thermoplastic elastomer.

For this combination, steps of embedding the radiation-proof laminate of the present invention would be reversed, that is the PC case is manufactured first, and the case is placed to face downwards into the mould for producing the TPR backplate, whereby ensuring the radiation-proof laminate to be mounted into the case in a proper orientation.

Alternatively, the radiation-proof laminate of the present invention could be simply placed at the back of the mobile phone, for example, it might be adhered to the back of the mobile phone, or it might be simply interposed between the case and the mobile phone. In summing up the above description, the technical problem to be solved by the present invention are: preventing the user of a wireless electronic device from the effect of the undesirable radiation while causing no impact on the wireless data transmission of the electronic device, i.e. absorbing effectively electromagnetic radiation associated with an electronic device (e.g. a mobile phone) and redirecting RF radiation of a user side while maintaining the RF signal strength not to be substantially affected or attenuated, whereby maintaining the quality of telephone communication.

The first radiation barrier layer of the present invention servers the purpose of: (1) re-directing the RF radiation along the edges of the laminate away from the user side for ensuring the RF signal strength not to be substantially affected or attenuated rather than directly absorbing or shielding the RF radiation; (2) absorbing a large part of electromagnetic radiation.

The second radiation barrier layer of the present invention is formed with an aluminum film capable of well absorbing electromagnetic radiation, and the third radiation barrier layer is formed with rubber based adhesive compound in the form of powder or liquid/fluid and aluminum powder in a desirable ratio; wherein these two layers are provided for absorbing completely the remaining electromagnetic radiation not yet absorbed by the first radiation barrier layer.

While the mobile phone is provided as an example for illustrating the use of the radiation-proof laminate of the present invention, it is apparent to a person skilled in the art that the present invention could be adapted for use with other electronic devices employing a wireless interface, such as a portable netbook, a tablet computer (e.g. iPad), and the like, or even any arbitrary electronic devices generating RF radiation or electromagnetic radiation.

It should be understood that the above are merely several illustrative but not limitative embodiments for introducing the working principles and configurations of the present invention, wherein various modifications and/or alterations may be made thereto by those skilled in the art in view of the teachings of the present invention, and these modifications and/or alterations shall fall into the scope as set forth by the accompanied claims.

What is claimed is:

1. A radiation-proof laminate for electronic devices, comprising:
    a substrate layer of an electrically conductive material, and
    a first radiation barrier layer formed on the substrate layer, wherein the first radiation barrier layer comprises 50 wt % to 70 wt % of rubber-based heat-bonding adhesive compound in the form of powder or liquid/fluid, 5 wt % to 20 wt % of aluminum powder, 5 wt % to 20 wt % of copper powder, and 5 wt % to 20 wt % of silver powder; wherein the aluminum powder, the copper powder, and the silver powder are mediated by the rubber-based heat-bonding adhesive compound to disperse and form a mesh-like distribution.

2. A radiation-proof laminate according to claim 1, wherein the first radiation barrier layer is formed by mixing the aluminum powder, the copper powder, the silver powder, and the rubber-based heat-bonding adhesive compound in the form of powder and applying the mixture onto the substrate layer.

3. A radiation-proof laminate according to claim 2, wherein the substrate layer is formed with a copper film having purity above 80%.

4. A radiation-proof laminate according to claim 1, wherein the substrate layer has a thickness in the range of 0.03 mm to 0.1 mm.

5. A radiation-proof laminate according to claim 4, wherein the thickness of the substrate layer is 0.05 mm.

6. A radiation-proof laminate according to claim 1, wherein the first radiation barrier layer comprises 55 wt % to 62 wt % of rubber-based heat-bonding adhesive compound, 8 wt % to 15 wt % of aluminum powder, 8 wt % to 15 wt % of copper powder, and 8 wt % to 15 wt % of silver powder.

7. A radiation-proof laminate according to claim 6, wherein the first radiation barrier layer comprises 60 wt % of rubber-based heat-bonding adhesive compound, 10 wt % of aluminum powder, 10 wt % of copper powder, and 10 wt % of silver powder.

8. A radiation-proof laminate according to claim 1, wherein the rubber contained in the rubber based heat-bonding adhesive compound is PC888.

9. A radiation-proof laminate according to claim 1, wherein each of the rubber based heat-bonding adhesive compound powder and the aluminum, copper and silver powders has a particle size in the range of 500 µm to 1000 µm.

10. A radiation-proof laminate according to claim 9, wherein the particle size is in the range of 700 µm to 900 µm.

11. A radiation-proof laminate according to claim 10, wherein the particle size is 800 µm.

12. A radiation-proof laminate according to claim 1, further comprising a second radiation barrier layer formed on the first radiation barrier layer, the second radiation barrier layer being formed with a material capable of absorbing electromagnetic radiation.

13. A radiation-proof laminate according to claim 12, wherein the second radiation barrier layer is an aluminum film having purity above 80%.

14. A radiation-proof laminate according to claim 12, wherein the second radiation barrier layer has a thickness in the range of 0.05 mm to 0.15 mm.

15. A radiation-proof laminate according to claim 14, wherein the thickness of the second radiation barrier layer is 0.1 mm.

16. A radiation-proof laminate according to claim 12, further comprising a third radiation barrier layer formed on the second radiation barrier layer, the third radiation barrier layer being formed with a material capable of absorbing electromagnetic radiation.

17. A radiation-proof laminate according to claim 16, wherein the third radiation barrier layer comprises 70 wt % to 95 wt % of rubber based adhesive compound in the form of powder or liquid/fluid and 5 wt % to 30 wt % of aluminum powder.

18. A radiation-proof laminate according to claim 17, wherein the third radiation barrier layer comprises 90 wt % of rubber based adhesive compound in the form of powder or liquid/fluid and 10 wt % of aluminum powder.

19. A radiation-proof laminate according to claim 16, wherein the rubber contained in the rubber based heat-bonding adhesive compound is PC888.

20. A radiation-proof laminate according to claim 1, wherein at least one pair of patterns with meandering curve parts is formed on one side of the substrate layer opposite to the first radiation barrier layer, and the pattern is made of an electrically conductive material.

21. A radiation-proof laminate according to claim 20, wherein the pattern is of rhomb, loop, or strip configuration.

22. A radiation-proof laminate according to claim 21, wherein the pattern comprises two parallel and concentric rhombs of different sizes that are nested together.

23. A radiation-proof laminate according to claim 21, wherein the pattern comprises a plurality of vertical and horizontal parallel lines to form a dendritic pattern.

24. A radiation-proof laminate according to claim 20, wherein the electrically conductive material is selected from aluminum, copper or a combination thereof.

25. A radiation-proof laminate according to claim 1, wherein the aluminum, copper, and silver powders are respectively replaced by their respective metal compounds.

26. A method for embedding a radiation-proof laminate according to claim 1 into a case of electronic device, comprising the steps of:
providing a plastic backplate having a molding temperature above 220° C.;
placing the radiation-proof laminate on a surface of the plastic backplate for better positioning of the laminate;
placing the plastic backplate with the laminate into a mold for producing the case of the electronic device; and
injection molding the case of the electronic device in a way that the plastic backplate and the laminate are embedded into the case of the electronic device.

27. A method according to claim 26, wherein the plastic backplate and the case of the electronic device are made of a material combination selected from the following:

| The plastic backplate/ molding temperature | + | the case/ molding temperature |
|---|---|---|
| 1) PC/220-230° C. | + | TPU/160-170° C. |
| 2) silicone type A/190-200° C. | + | silicone type B/150-160° C. | wherein PC is polycarbonate, TPU is thermoplastic polyurethane elastomer rubber.

28. A method for embedding a radiation-proof laminate according to claim 1 into a case of electronic device, comprising the steps of:
injection molding the case of the electronic device;
placing and fixing the radiation-proof laminate into a mold for producing a plastic backplate having a molding temperature below 200° C.;
placing the molded case of the electronic device into the mold for producing the plastic backplate, with a lower surface of the case facing the radiation-proof laminate; and
injection molding the plastic backplate in a way that the plastic backplate and the laminate are embedded into the case of the electronic device.

29. A method according to claim 28, wherein the plastic backplate and the case of the electronic device are made of a material combination selected from the following:

| plastic backplate/ molding temperature | + | the case/ molding temperature |
|---|---|---|
| TPR/160-170° C. | + | PC/220-230° C. | wherein PC is polycarbonate, TPR is thermoplastic rubber or thermoplastic elastomer.

\* \* \* \* \*